US011366142B2

(12) United States Patent
Jefferies et al.

(10) Patent No.: US 11,366,142 B2
(45) Date of Patent: Jun. 21, 2022

(54) MULTI-DEVICE CURRENT MEASUREMENT CROSSTALK COMPENSATION

(71) Applicant: Schneider Electric USA, Inc., Andover, MA (US)

(72) Inventors: Kevin M. Jefferies, Raleigh, MA (US); Benjamin W. Edwards, Rolesville, NC (US); Richard K. Weiler, Wake Forest, NC (US); Alan Freeman, Raleigh, NC (US); Konstantin Filippenko, Cary, NC (US)

(73) Assignee: Schneider Electric USA, Inc., Boston, MA (US)

( * ) Notice: Subject to any disclaimer, the term of this patent is extended or adjusted under 35 U.S.C. 154(b) by 276 days.

(21) Appl. No.: 16/692,089

(22) Filed: Nov. 22, 2019

(65) Prior Publication Data
US 2021/0156895 A1 May 27, 2021

(51) Int. Cl.
*G01R 19/25* (2006.01)
(52) U.S. Cl.
CPC .................. *G01R 19/2506* (2013.01)
(58) Field of Classification Search
CPC ............ G01R 19/25; G01R 19/0092; G01R 19/0053; G01R 19/0046; G01R 19/002; G01R 19/00; G01R 15/20; G01R 15/18; G01R 15/14; G01R 15/00; G01R 19/2506
See application file for complete search history.

(56) References Cited

U.S. PATENT DOCUMENTS

| 4,432,031 A | 2/1984 | Premerlani |
| 5,736,846 A | 4/1998 | Floru et al. |
| 5,940,057 A | 8/1999 | Lien et al. |

(Continued)

FOREIGN PATENT DOCUMENTS

WO 01/50142 A1 7/2001

OTHER PUBLICATIONS

Niewczas et al., "Magnetic Cross-Talk Compensation for an Optical Current Transformer", 2000, IEEE, pp. 1442-1447. (Year: 2000).*

(Continued)

*Primary Examiner* — Mohamed Charioui
(74) *Attorney, Agent, or Firm* — Locke Lord LLP

(57) ABSTRACT

A measurement module receives crosstalk compensation factors that include distance factors based on respective distances of a current sensor of the module from respective current sensors of other measurement modules and phase difference factors based on respective differences between the phase of a source current measured by the module and respective phases of source currents measured by the other modules. The module monitors messages reporting current measurements transmitted from the other modules connected to a broadcast bus, of current measurements made by respective current sensors of the other modules measuring other respective source currents. The module determines a reported current that is computed as a function of current measurement by the module's current sensor, reported current measurements monitored from the other modules, and the received crosstalk compensation factors. The module transmits the determined reported current over the broadcast bus to the other modules and a central controller.

20 Claims, 6 Drawing Sheets

(56) References Cited

U.S. PATENT DOCUMENTS

| | | | |
|---|---|---|---|
| 6,529,013 B2 | 3/2003 | Skendzic et al. | |
| 6,727,682 B1 | 4/2004 | Tobin | |
| 7,292,042 B2 | 11/2007 | Morita et al. | |
| 7,589,537 B1 | 9/2009 | Kraz | |
| 7,613,783 B2 | 11/2009 | Naismith | |
| 8,334,670 B2 | 12/2012 | Meyer, III | |
| 8,952,615 B2 | 2/2015 | Dupuy et al. | |
| 2002/0180459 A1* | 12/2002 | Skendzic | G01R 15/06 324/628 |
| 2005/0286190 A1 | 12/2005 | Rostron et al. | |
| 2013/0229173 A1 | 9/2013 | Bertrand | |
| 2014/0380021 A1 | 12/2014 | Ochi | |
| 2015/0331079 A1* | 11/2015 | Kolwalkar | G01R 19/2503 702/104 |
| 2016/0011239 A1* | 1/2016 | Yoon | G01R 15/20 324/126 |
| 2016/0062718 A1 | 3/2016 | Yu et al. | |
| 2017/0269134 A1* | 9/2017 | Fu | G01R 35/005 |

OTHER PUBLICATIONS

Extended European Search Report dated May 10, 2021 for European Patent Application No. EP20205694.1-1010, 5 pages.

\* cited by examiner

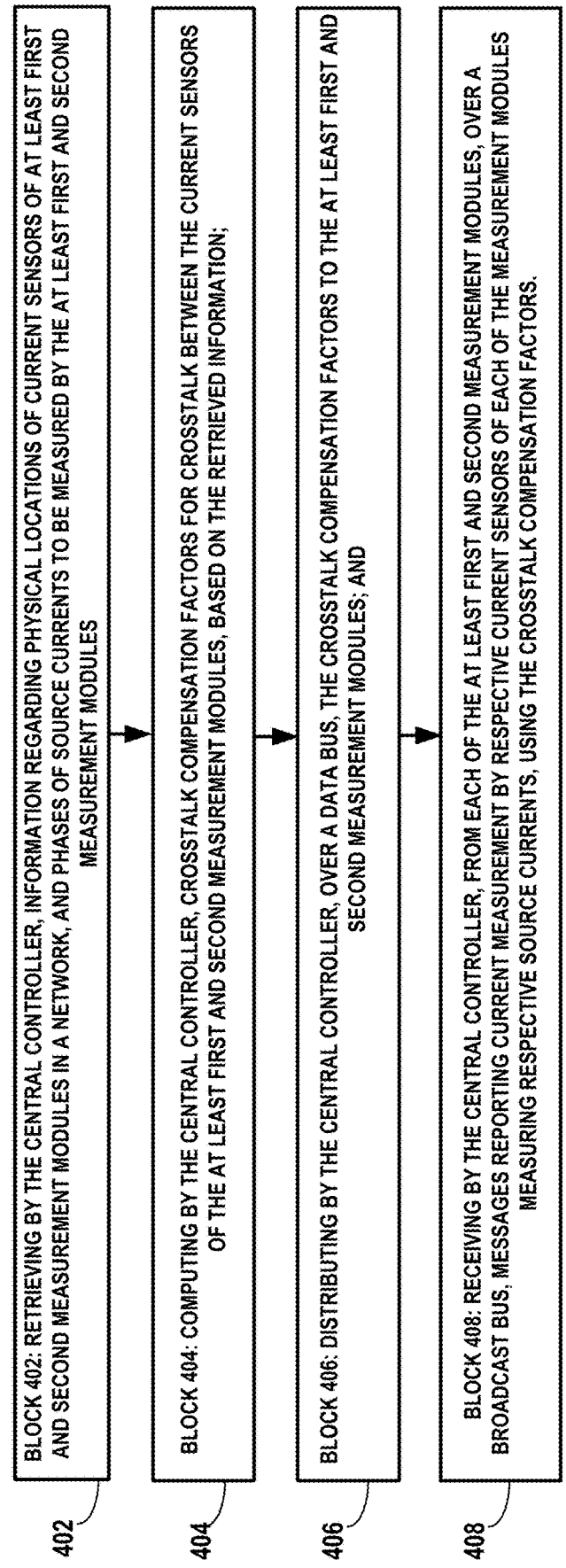

FIG. 4A   LOGIC BLOCKS OF THE CENTRAL CONTROLLER 100 MINIMIZING CROSSTALK 400

BLOCK 402: RETRIEVING BY THE CENTRAL CONTROLLER, INFORMATION REGARDING PHYSICAL LOCATIONS OF CURRENT SENSORS OF AT LEAST FIRST AND SECOND MEASUREMENT MODULES IN A NETWORK, AND PHASES OF SOURCE CURRENTS TO BE MEASURED BY THE AT LEAST FIRST AND SECOND MEASUREMENT MODULES

BLOCK 404: COMPUTING BY THE CENTRAL CONTROLLER, CROSSTALK COMPENSATION FACTORS FOR CROSSTALK BETWEEN THE CURRENT SENSORS OF THE AT LEAST FIRST AND SECOND MEASUREMENT MODULES, BASED ON THE RETRIEVED INFORMATION;

BLOCK 406: DISTRIBUTING BY THE CENTRAL CONTROLLER, OVER A DATA BUS, THE CROSSTALK COMPENSATION FACTORS TO THE AT LEAST FIRST AND SECOND MEASUREMENT MODULES; AND

BLOCK 408: RECEIVING BY THE CENTRAL CONTROLLER, FROM EACH OF THE AT LEAST FIRST AND SECOND MEASUREMENT MODULES, OVER A BROADCAST BUS, MESSAGES REPORTING CURRENT MEASUREMENT BY RESPECTIVE CURRENT SENSORS OF EACH OF THE MEASUREMENT MODULES MEASURING RESPECTIVE SOURCE CURRENTS, USING THE CROSSTALK COMPENSATION FACTORS.

MULTI-DEVICE CURRENT MEASUREMENT CROSSTALK COMPENSATION

TECHNICAL FIELD

The present disclosure relates to minimizing crosstalk, and more particularly, to minimizing crosstalk between current sensors that are located close together and are susceptible to crosstalk.

BACKGROUND

Systems with many current-carrying devices that are densely packed together may have closely routed conductors that each provide the source current to the respective device. Current sensors monitoring source currents on closely routed conductors are often placed next to each other in large rows. The source current in a primary conductor being measured by one current sensor creates a magnetic field that may inadvertently link with a neighboring current sensor on a neighboring primary conductor, causing false readings or crosstalk of the source current in the neighboring primary conductor. Such false readings are dependent on the magnitude of the source currents being measured and the distance between the primary conductors, which is approximately the same as the distance between the current sensors. The problem of false readings or crosstalk is exacerbated by having smaller, lower cost sensors in smaller sized electronic products.

SUMMARY

In accordance with one embodiment described herein, a measurement module receives crosstalk compensation factors from a central controller, which include distance factors based on respective distances of a current sensor of the measurement module from respective current sensors of other measurement modules and phase difference factors based on respective differences between the phase of a source current measured by the measurement module and respective phases of source currents measured by the other modules. The measurement module monitors messages reporting current measurements transmitted from the other modules connected to a broadcast bus, of current measurements made by respective current sensors of the other modules measuring other respective source currents. The measurement module determines its own reported current that is computed as a function of current measurement by the measurement module's current sensor, the reported current measurements monitored by the other modules, and the received crosstalk compensation factors. The measurement module transmits the determined reported current over the broadcast bus to the other modules and a central controller.

In accordance with one embodiment described herein, a method, comprises receiving by the measurement module, from a central controller, over a data bus, crosstalk compensation factors, monitoring by the measurement module, over a broadcast bus, messages reporting current measurements transmitted from other measurement modules connected to the broadcast bus, of current measurements made by respective current sensors of the other measurement modules measuring other respective source currents, receiving by the measurement module, a current measurement by a current sensor of the measurement module measuring a source current, determining by the measurement module, a reported current that is computed as a function of the current measurement by the current sensor, the reported current measurements monitored from the other measurement modules, and the received crosstalk compensation factors, and transmitting by the measurement module, the determined reported current over the broadcast bus to the other measurement modules and the central controller.

In accordance with an embodiment described herein, the method further comprises the crosstalk compensation factors including distance factors based on respective distances of the current sensor of the measurement module from the respective current sensors of the other measurement modules and phase difference factors based on respective differences between the phase of the source current measured by the measurement module and the respective phases of the source currents measured by the other measurement modules.

In accordance with another embodiment described herein, a method, comprises retrieving by a central controller, information regarding physical locations of current sensors of at least first and second measurement modules in a network, and phases of source currents to be measured by the at least first and second measurement modules, computing by the central controller, crosstalk compensation factors for crosstalk between the current sensors of the at least first and second measurement modules, based on the retrieved information, distributing by the central controller, over a data bus, the crosstalk compensation factors to the at least first and second measurement modules, and receiving by the central controller, from each of the at least first and second measurement modules, over a broadcast bus, messages reporting current measurement by respective current sensors of each of the measurement modules measuring respective source currents, using the crosstalk compensation factors.

The resulting method, apparatus, system, and computer program product mitigate the effects of crosstalk between current sensors that are located close together and are susceptible to crosstalk.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

Figure 1:
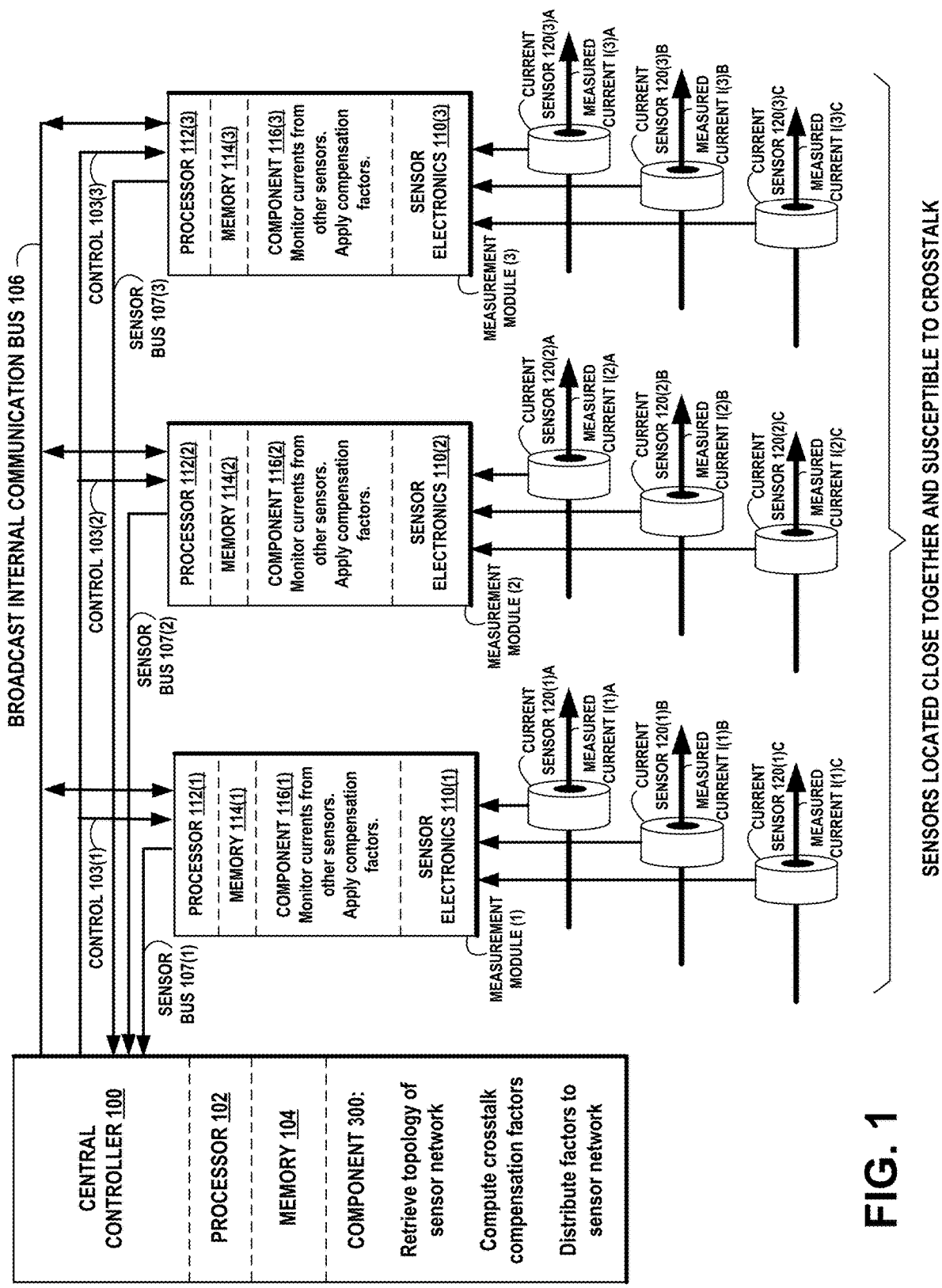
FIG. 1 is an example functional block diagram of a central controller distributing crosstalk compensation factors to a plurality of measurement modules, to minimize crosstalk between current sensors of the modules, according to an embodiment of the disclosure.
Figure 2:
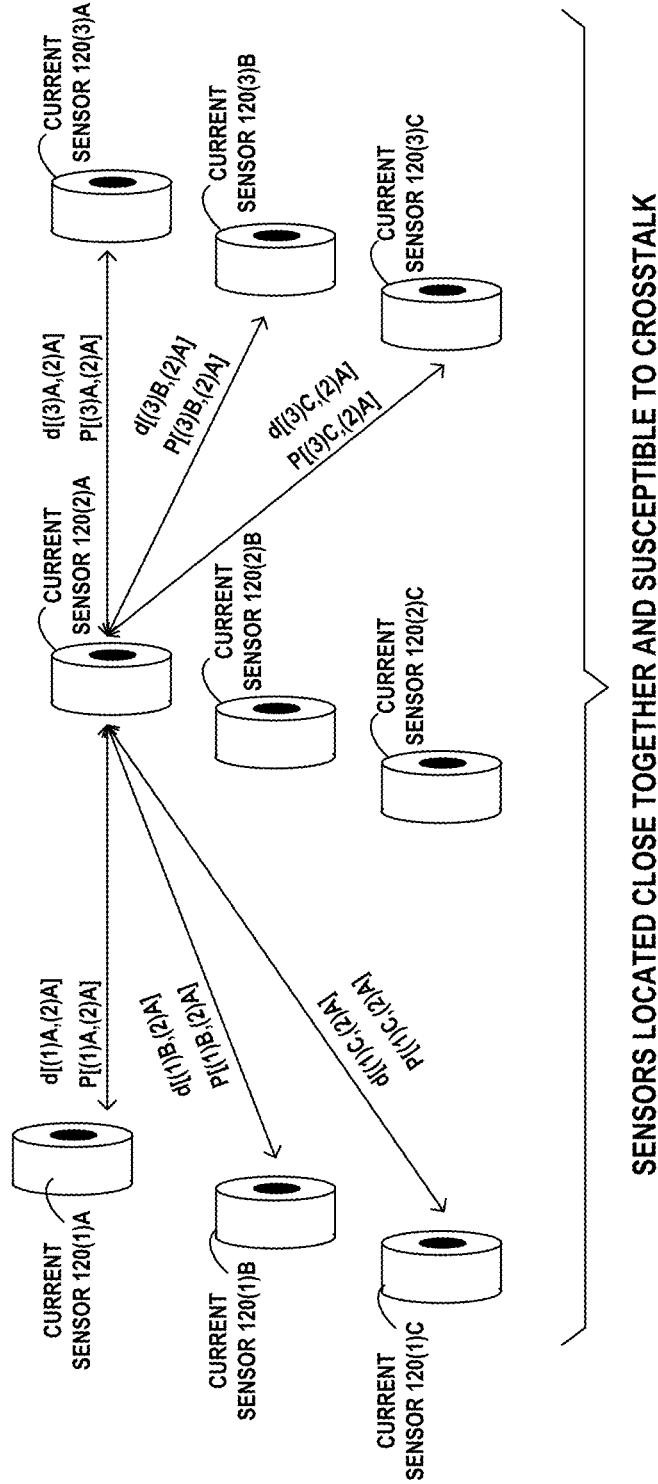
FIG. 2 shows an example arrangement of the current sensors of FIG. 1, located close together and susceptible to crosstalk, according to an embodiment of the disclosure.

FIG. 1 is an example functional block diagram of a central controller 100 distributing crosstalk compensation factors to a plurality of measurement modules 1, 2, and 3, to minimize crosstalk between current sensors 120(1)A through 120(3)C of the modules, according to an embodiment of the disclosure. The central controller 100 includes at least one processor 102 and at least one memory 104 that includes computer program code that, when executed by operation of the processor 102, performs operations of logic blocks in the component 300. The logic blocks retrieve information regarding physical locations of the current sensors 120(1)A through 120(3)C shown in FIG. 2, which may be located close together and susceptible to crosstalk.

The current sensors 120(1)A through 120(3)C may be any commonly used type of current sensors, such as for example current transformers, Rogoswki coils, Hall effect sensors, or any other type of current sensors. In the example shown in FIGS. 1, 2, and 3, the current sensors 120(1)A through 120(3)C are current transformers. A current transformer is a toroidal coil arranged directly around a conductor of a source current, such as a busbar or cable that passes through the approximate center of the toroidal coil. The conductor of the source current is the primary conductor in the transformer and the toroidal coil is the secondary conductor in the transformer. The magnetic field produced by the source current links with the surrounding toroidal coil inducing a secondary current, whose magnitude is measured and is approximately proportional to the magnitude of the source current.

The distance d between the respective centers of the toroidal coils of the two sensors 120(1)A and 120(2)A, for example, is expressed as d[(1)A,(2)A]. The distance d[(1)A,(2)A] is also substantially the same as the separation distance between the respective conductors of the source currents I(1)A and I(2)A. The logic blocks of the component 300 also retrieve information regarding the phases A, B, or C of the source currents I(1)A and I(2)A, for example, measured by the sensors 120(1)A and 120(2)A of measurement modules 1 and 2. The difference in the phase angles of the source currents I(1)A and I(2)A, for example, is expressed as P[(1)A,(2)A]. The distances between the current sensors 120(1)A through 120(3)C of the modules 1, 2, and 3 and the phase angle differences of the source currents 41). A through I(3)C may be determined by topology after the sensors have been assembled together and configured.

Figure 3:
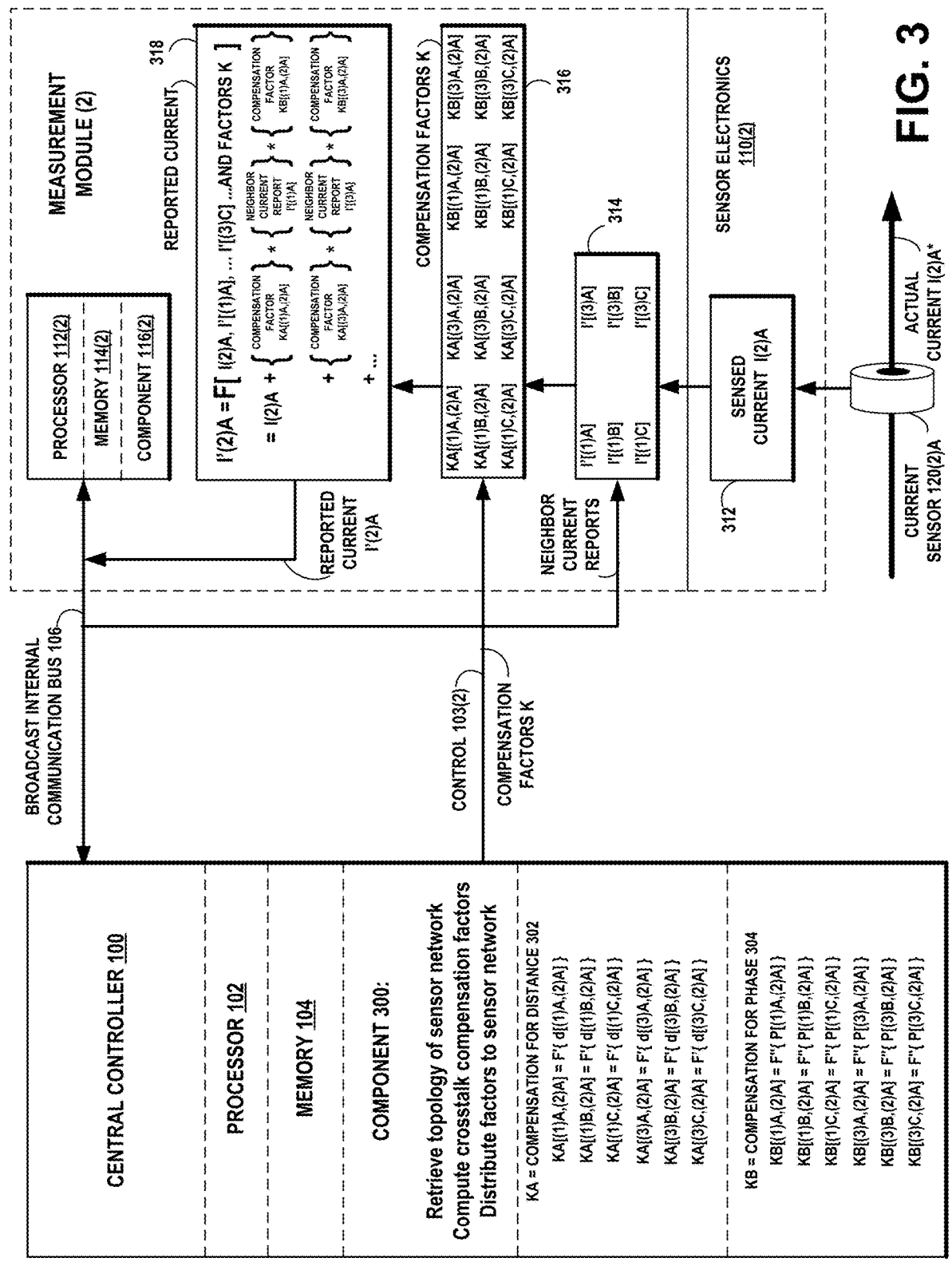
FIG. 3 is an example functional block diagram of the central controller and one of the measurement modules and its current sensor of FIG. 1, determining a reported current as a function of the current measurement by the current sensor, reported current measurements monitored from the other measurement modules of FIG. 2, and the received crosstalk compensation factors, according to an embodiment of the disclosure.

The logic blocks in the component 300 compute crosstalk compensation factors K for crosstalk between the current sensors 120(1)A through 120(3)C of the measurement modules 1, 2, and 3, based on the retrieved information of the distances between the sensors and the phase differences of the source currents measured by the sensors. FIG. 3 is an example functional block diagram of the central controller 100 and one of the measurement modules 2 and its current sensor 120(2)A of FIG. 1, illustrating a more detailed representation of the crosstalk compensation factors K. Block 302 of the component 300 computes the distance portion KA of the compensation factor K. For example, the distance portion KA of the compensation factor K for the distance d[(1)A,(2)A] between the sensors 120(1)A and 120(2)A, is expressed as KA[(1)A,(2)A]=F'{d[(1)A,(2)A]}, where F' is a function of the distance d[(1)A,(2)A]. For example, the distance portion KA[(1)A,(2)A] between the sensors 120(1)A and 120(2)A may be computed as the ratio of a constant, such as 0.05, divided by the square of the distance d between the respective centers of the toroidal coils of the two sensors. The function F' may be also be empirically determined through testing and analysis of the particular arrangement of the current sensors. The effects of crosstalk are more significant on a small sensor measuring a small source current, which is near to a larger sensor measuring a large source current.

Block 304 of the component 300 computes the phase portion KB of the compensation factor K. The phase portion KB of the compensation factor K for the difference in the phases P[(1)A,(2)A] of the source currents I(1)A and I(2)A, for example, is expressed as KB[(1)A,(2)A]=F"{P[(1)A,(2)A]}, where F" is a function of the difference in the phases P[(1)A,(2)A]. For example, the phases A, B, and C may be 120 degrees apart in three-phase, 60 Hz source currents, and these relationships are used in computing the phase portion KB of the compensation factor K. The function F" may be also be empirically determined through testing and analysis of the particular arrangement of the current sensors.

The logic blocks in the component 300 of the central controller 100 distribute the crosstalk compensation factors over a data bus or control bus 103(1), 103(2), 103(3), of FIG. 1 to the respective measurement modules 1, 2, and 3. Each of the measurement modules 1, 2, and 3 includes at least one processor 112(1), 112(2), 112(3), and at least one respective memory 114(1), 114(2), 114(3) that includes computer program code that, when executed by operation of the respective processor 112(1), 112(2), 112(3), performs operations of logic blocks in the respective components 116(1), 116(2), 116(3). Each of the measurement modules 1, 2, and 3 may communicate with the central controller 100 over a respective sensor bus 107(1), 107(2), 107(3). The logic blocks of the respective measurement modules 1, 2, and 3 receive from the central controller 100, over the control bus 103(1), 103(2), 103(3), the crosstalk compensation factors K.

The logic blocks of the respective measurement modules 1, 2, and 3 monitor over a broadcast bus 106, messages reporting current measurements transmitted from neighboring measurement modules connected to the broadcast bus 106, of current measurements made by respective current sensors of the neighboring measurement modules measuring other respective source currents. FIG. 3 shows, for example, one of the measurement modules 2 and its current sensor 120(2)A. The figure illustrates a more detailed representation of how the neighbor current report messages, for example I'[(1)A] from neighboring current sensor 120(1)A, are combined with the crosstalk compensation factors KA[(1)A,(2)A] and KB[(1)A,(2)A] to minimize the effects of crosstalk between sensor 120(1)A and sensor 120(2)A.

The actual, primary source current "I(2)A*" is sensed by the current sensor 120(2)A, which outputs a secondary current I(2)A to register 312 of the sensor electronics 110(2) of measurement module 2. The neighbor current report messages, for example I'[(1)A] from neighboring current sensor 120(1)A, is received over the broadcast bus 106 and registered at register 314. The crosstalk compensation factors K received over the control bus 103(2) are registered at register 316. The reported current I'(2)A that is to be output by the measurement module over the broadcast bus 106, is computed by processor 112(2) and registered at register 318.

The reported current I'(2)A output by measurement module 2, which is compensated for the effect all of the neighboring current sensors, may be expressed as: I'(2)A=F{I(2)A, I'[(1)A], I'[(3)C] . . . and the crosstalk compensation factors K}, where F is a function of the locally measured current I(2)A, the reported other currents I'[(1)A], I'[(3)C], and the crosstalk compensation factors K. The function F may be empirically determined through testing and analysis of the particular arrangement of the current sensors.

One example of the function F for the computation of I'(2)A output by measurement module 2, which is compensated for the effect by all of the neighboring current sensors, may be expressed as:

$$I'(2)A=I(2)A+\{KA[(1)A,(2)A]\}*\{I'[(1)A]\}*\{KB[(1)A,(2)A]\}+\{KA[(3)A,(2)A]\}*\{I'[(3)A]\}*\{KB[(3)A,(2)A]\}+$$

The logic blocks of the measurement module 2 transmit the reported current I'(2)A, which is output by measurement module 2 over the broadcast bus 106 to the other measurement modules 1 and 3 and to the central controller 100.

The central controller 100 receives from each of the measurement modules 1, 2, and 3, over the broadcast bus 106, the messages, for example I'(2)A, reporting the current measurements by the respective current sensors, for example 120(2)A, of each of the measurement modules measuring their respective source currents, using the crosstalk compensation factors K.

In an embodiment, the reported current, for example I'(2)A, may be computed as a function of a root-mean-squared (RMS) current measurement by the current sensor 120(2)A, a reported root-mean-squared (RMS) current measurement monitored from each of the other measurement modules, and the received crosstalk compensation factors.

In an embodiment, the reported current, for example I'(2)A, may be computed as a function of an instantaneous sampling of the current measurement by the current sensor120(2)A, a reported instantaneous sampling of the current measurement monitored from each of the other measurement modules, and the received crosstalk compensation factors.

Figure 4:
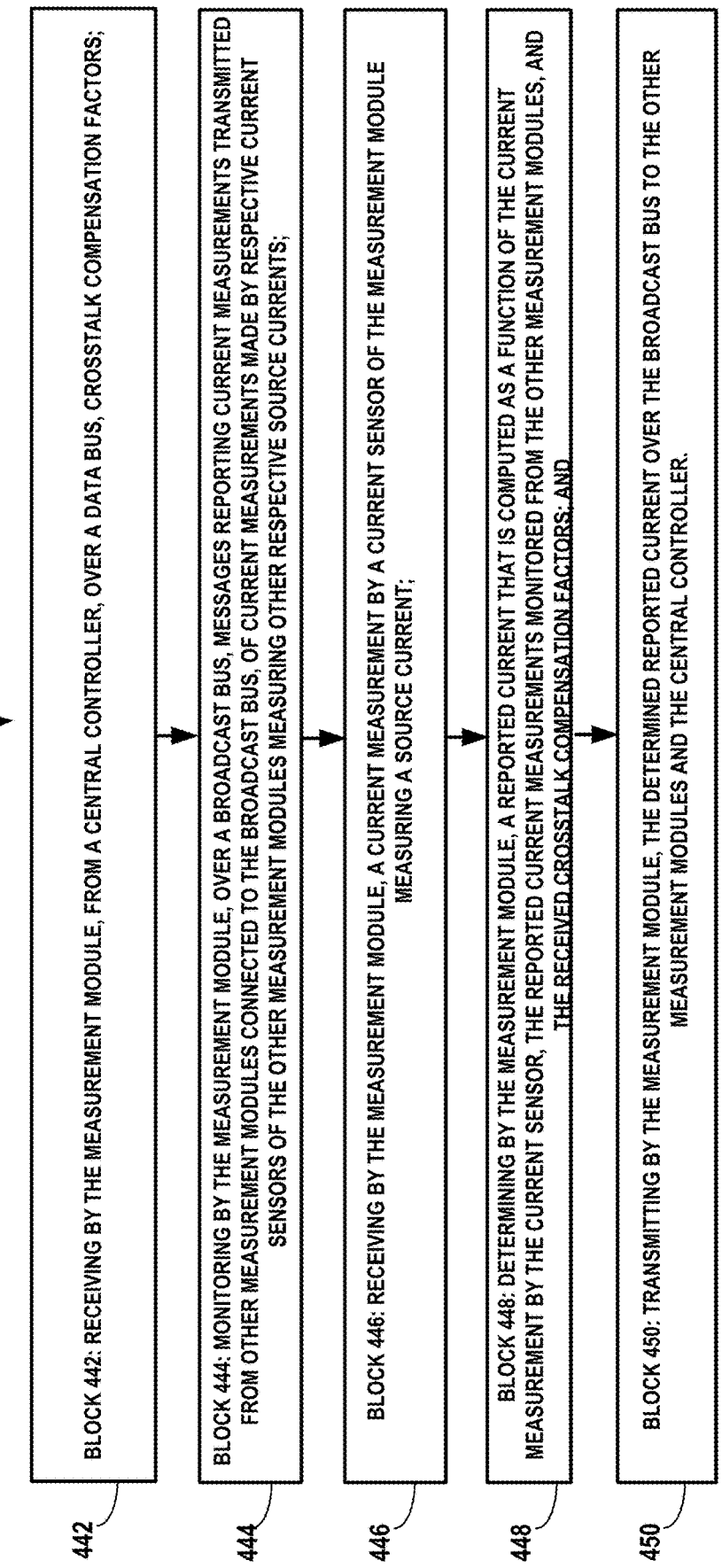
FIG. 4A is an example flow diagram of a method performed by the example central controller of FIG. 3, according to an embodiment of the disclosure.
FIG. 4B is an example flow diagram of a method performed by the example measurement module of FIG. 3, according to an embodiment of the disclosure.

FIG. 4A is an example flow diagram 400 of a method performed by the component 300 of the example central controller 100 of FIG. 3, according to an embodiment of the disclosure. The logic blocks of the flow diagram 400 may be implemented by computer program instructions stored in the memory 104 and executed by the processor 102 in the central controller 100 of FIG. 1. Alternately, the logic blocks of the flow diagram 400 may also be implemented by computer hardware logic in the central controller 100 of FIG. 1, which can carry out the functions specified by the logic blocks.

The method performed by the example central controller 100 for minimizing crosstalk, comprises the following logic blocks:

Block 402: retrieving by the central controller, information regarding physical locations of current sensors of at least first and second measurement modules in a network, and phases of source currents to be measured by the at least first and second measurement modules;

Block 404: computing by the central controller, crosstalk compensation factors for crosstalk between the current sensors of the at least first and second measurement modules, based on the retrieved information;

Block 406: distributing by the central controller, over a data bus, the crosstalk compensation factors to the at least first and second measurement modules; and Block 408: receiving by the central controller, from each of the at least first and second measurement modules, over a broadcast bus, messages reporting current measurement by respective current sensors of each of the measurement modules measuring respective source currents, using the crosstalk compensation factors.

FIG. 4B is an example flow diagram 440 of a method performed by the component 116(2) of the example measurement module 2 of FIG. 3, according to an embodiment of the disclosure. The logic blocks of the flow diagram 440 may be implemented by computer program instructions stored in the memory 114(2) and executed by the processor 112(2) in the measurement module 2 of FIG. 3. Alternately, the logic blocks of the flow diagram 440 may also be implemented by computer hardware logic in the measurement module 2 of FIG. 3, which can carry out the functions specified by the logic blocks.

The method performed by the example measurement module 2 of FIG. 3 for minimizing crosstalk, comprises the following logic blocks:

Block 442: receiving by the measurement module, from a central controller, over a data bus, crosstalk compensation factors;

Block 444: monitoring by the measurement module, over a broadcast bus, messages reporting current measurements transmitted from other measurement modules connected to the broadcast bus, of current measurements made by respective current sensors of the other measurement modules measuring other respective source currents;

Block 446: receiving by the measurement module, a current measurement by a current sensor of the measurement module measuring a source current;

Block 448: determining by the measurement module, a reported current that is computed as a function of the current measurement by the current sensor, the reported current measurements monitored from the other measurement modules, and the received crosstalk compensation factors; and Block 450: transmitting by the measurement module, the determined reported current over the broadcast bus to the other measurement modules and the central controller.

Figure 5:
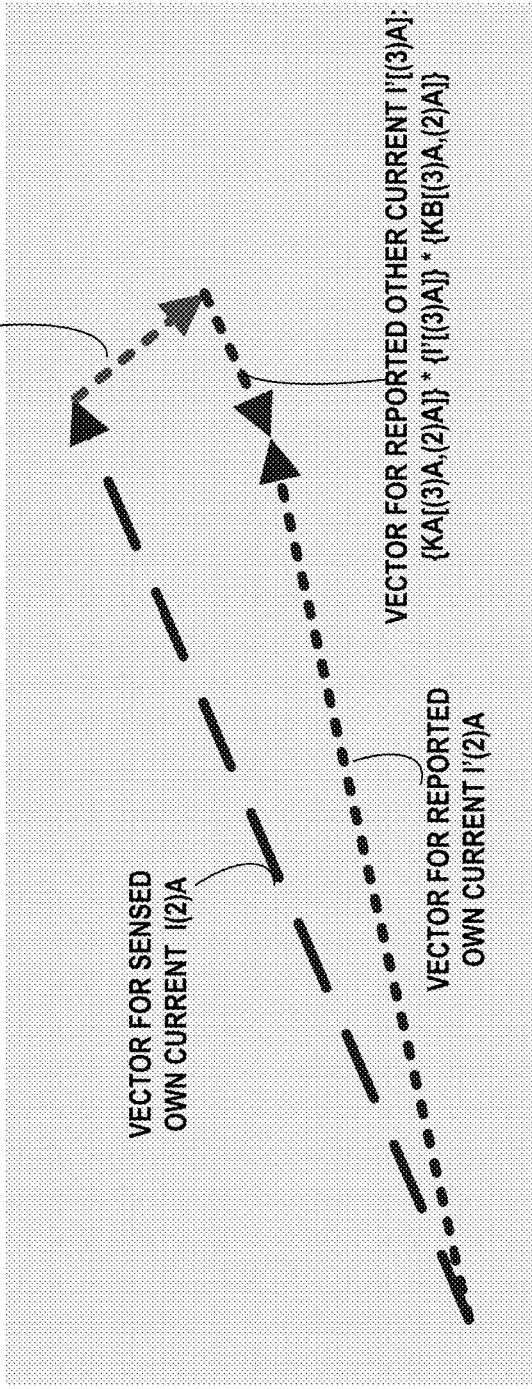
FIG. 5 is an example vector summation diagram determining the reported current as the vector sum of a vector representing the current measurement by one of the measurement modules and its current sensor, and vectors representing the monitored current measurement from each respective one of the other measurement modules, as modified by the crosstalk compensation factors, according to an embodiment of the disclosure.

FIG. 5 is an example vector summation diagram determining the reported current I'(2)A computed as a vector summation of a vector representing the sensed own current measurement I(2)A by the current sensor 120(2)A, and vectors representing respective products of the distance factor (KA), the phase difference factor (KB), and the reported monitored current measurement I'[(1)A, I'[(3)A, . . . from each respective one of the other measurement modules 1 and 3. Reported Other Current I'[(1)A]: {KA[(1)A,(2)A]}*{I'[(1)A]}*{KB[(1)A,(2)A]} and Reported Other Current I'[(3)A]: {KA[(3)A,(2)A]}*{I'[(3)A]}*{KB[(3)A,(2)A]}.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "component", "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

What is claimed is:

1. A measurement module for minimizing crosstalk, comprising:
   at least one processor;
   at least one memory including computer program code, wherein the computer program code, when executed by operation of the at least one processor, performs an operation comprising:
      receiving, from a central controller, over a data bus, crosstalk compensation factors;
      monitoring, over a broadcast bus, messages reporting current measurements transmitted from other measurement modules connected to the broadcast bus, of current measurements made by respective current sensors of the other measurement modules measuring other respective source currents;
      measuring a source current using a current sensor of the measurement module to generate a current measurement;
      determining a reported current that is computed as a function of at least (i) the current measurement by the current sensor, (ii) the reported current measurements from the other measurement modules, and (iii) the received crosstalk compensation factors; and
      transmitting the determined reported current over the broadcast bus to at least one of (i) one or more other measurement modules of the other measurement modules and (ii) the central controller;
   wherein the central controller is configured to retrieve information regarding physical locations of the current sensors of at least two of the measurement modules, and phases of source currents to be measured by the at least two measurement modules;
   wherein the central controller is configured to compute the crosstalk compensation factors for crosstalk between the current sensors of the at least two measurement modules, based on the retrieved information, and to transmit the crosstalk compensation factors to the at least two measurement modules; and
   wherein the central controller is configured to receive the determined reported current over the broadcast bus from respective ones of the at least two measurement modules measuring respective source currents, using the crosstalk compensation factors.

2. The measurement module of claim 1, wherein the crosstalk compensation factors include distance factors based on respective distances of the current sensor of the measurement module from respective current sensors of the other measurement modules and phase difference factors based on respective differences between phase of the source current measured by the measurement module and respective phases of the source currents measured by the other measurement modules.

3. The measurement module of claim 2, wherein the distance factors and the phase difference factors are determined by topology after the measurement module and the other measure modules are assembled together.

4. The measurement module of claim 2, wherein the reported current is computed as a vector summation of a vector representing the current measurement by the current sensor, and vectors representing respective products of the distance factor, the phase difference factor, and the reported current measurement from each respective one of the other measurement modules.

5. The measurement module of claim 1, wherein the reported current is computed as a function of a root-mean-squared (RMS) current measurement by the current sensor, a reported root-mean-squared (RMS) current measurement monitored from each of the other measurement modules, and the received crosstalk compensation factors.

6. The measurement module of claim 1, wherein the reported current is computed as a function of an instantaneous sampling of the current measurement by the current sensor, a reported instantaneous sampling of the current measurement monitored from each of the other measurement modules, and the received crosstalk compensation factors.

7. A method for minimizing crosstalk, comprising:
receiving from a central controller, over a data bus, crosstalk compensation factors;
monitoring over a broadcast bus, messages reporting current measurements transmitted from other measurement modules connected to the broadcast bus, of current measurements made by respective current sensors of the other measurement modules measuring other respective source currents;
measuring a source current using a current sensor of the measurement module to generate a current measurement;
determining a reported current that is computed as a function of (i) the current measurement by the current sensor, (ii) the reported current measurements from the other measurement modules, and (iii) the received crosstalk compensation factors; and
transmitting the determined reported current over the broadcast bus;
wherein the central controller is configured to retrieve information regarding physical locations of the current sensors of at least two of the measurement modules, and phases of source currents to be measured by the at least two measurement modules;
wherein the central controller is configured to compute the crosstalk compensation factors for crosstalk between the current sensors of the at least two measurement modules, based on the retrieved information, and to transmit the crosstalk compensation factors to the at least two measurement modules; and
wherein the central controller is configured to receive the determined reported current over the broadcast bus from respective ones of the at least two measurement modules measuring respective source currents, using the crosstalk compensation factors.

8. The method of claim 7, wherein the crosstalk compensation factors include distance factors based on respective distances of the current sensor of the measurement module from respective current sensors of the other measurement modules and phase difference factors based on respective differences between phase of the source current measured by the measurement module and respective phases of the source currents measured by the other measurement modules.

9. The method of claim 8, wherein the distance factors and the phase difference factors are determined by topology after the measurement module and the other measurement modules are assembled together.

10. The method of claim 8, wherein the reported current is computed as a vector summation of a vector representing the current measurement by the current sensor, and vectors representing respective products of the distance factor, the phase difference factor, and the reported current measurement from each respective one of the other measurement modules.

11. The method of claim 7, wherein the reported current is computed as a function of a root-mean-squared (RMS) current measurement by the current sensor, a reported root-mean-squared (RMS) current measurement monitored from each of the other measurement modules, and the received crosstalk compensation factors.

12. The method of claim 7, wherein the reported current is computed as a function of an instantaneous sampling of the current measurement by the current sensor, a reported instantaneous sampling of the current measurement monitored from each of the other measurement modules, and the received crosstalk compensation factors.

13. A computer program product, comprising computer executable program code recorded on a computer-readable non-transitory medium, the computer executable program code comprising:
code for receiving from a central controller, over a data bus, crosstalk compensation factors;
code for monitoring over a broadcast bus, messages reporting current measurements transmitted from other measurement modules connected to the broadcast bus, of current measurements made by respective current sensors of the other measurement modules measuring other respective source currents;
code for measuring a source current using a current sensor of the measurement module to generate a current measurement;
code for determining a reported current that is computed as a function of (i) the current measurement by the current sensor, (ii) the reported current measurements from the other measurement modules, and (iii) the received crosstalk compensation factors; and
code for transmitting the determined reported current over the broadcast bus to the other measurement modules and the central controller;
wherein the central controller is configured to retrieve information regarding physical locations of the current sensors of at least two of the measurement modules, and phases of source currents to be measured by the at least two measurement modules;
wherein the central controller is configured to compute the crosstalk compensation factors for crosstalk between the current sensors of the at least two measurement modules, based on the retrieved information, and to transmit the crosstalk compensation factors to the at least two measurement modules; and wherein the central controller is configured to receive the determined reported current over the broadcast bus from respective ones of the at least two measurement modules measuring respective source currents, using the crosstalk compensation factors.

14. The computer program product of claim 13, wherein the crosstalk compensation factors include distance factors based on respective distances of the current sensor of the measurement module from respective current sensors of the other measurement modules and phase difference factors based on respective differences between phase of the source current measured by the measurement module and respective phases of the source currents measured by the other measurement modules.

15. The computer program product of claim 14, wherein the distance factors and the phase difference factors are determined by topology after the measurement module and the other measurement modules are assembled together.

16. A central controller for minimizing crosstalk, comprising:

at least one processor;

at least one memory including computer program code, wherein the computer program code, when executed by operation of the processor, performs an operation comprising:

retrieving by the central controller, information regarding physical locations of current sensors of at least first and second measurement modules in a network, and phases of source currents to be measured by the at least first and second measurement modules;

computing by the central controller, crosstalk compensation factors for crosstalk between the current sensors of the at least first and second measurement modules, based on the retrieved information;

distributing by the central controller, over a data bus, the crosstalk compensation factors to the at least first and second measurement modules; and receiving by the central controller, from each of the at least first and second measurement modules, over a broadcast bus, messages reporting current measurement by respective current sensors of each of the measurement modules measuring respective source currents, using the crosstalk compensation factors;

wherein the at least first and second measurement modules are configured to monitor, over the broadcast bus, the messages reporting current measurements transmitted from other measurement modules connected to the broadcast bus, of current measurements made by respective current sensors of the other measurement modules measuring other respective source currents;

wherein the at least first and second measurement modules are configured to determine a respective reported current that is computed as a function of at least (i) a current measurement by the current sensor of respective ones of the at least first and second measurement modules, (ii) the reported current measurements from the other measurement modules, and (iii) the crosstalk compensation factors received from the central controller; and wherein the at least first and second measurement modules are configured to transmit the determined respective reported current over the broadcast bus to at least one of (i) the other measurement modules and (ii) to the central controller.

17. The central controller of claim 16, wherein the crosstalk compensation factors include distance factors based on respective distances separating the current sensors of each of the at least first and second measurement modules, and phase difference factors based on respective differences between phases of source currents measured by each of the at least first and second measurement modules.

18. The central controller of claim 17, wherein the distance factors and the phase difference factors are determined by topology after the measurement module and the other measurement modules are assembled together.

19. A method in a central controller for minimizing crosstalk, comprising:

retrieving, by the central controller, information regarding physical locations of current sensors of at least first and second measurement modules in a network, and phases of source currents to be measured by the at least first and second measurement modules;

computing, by the central controller, crosstalk compensation factors for crosstalk between the current sensors of the at least first and second measurement modules, based on the retrieved information;

distributing, by the central controller, over a data bus, the crosstalk compensation factors to the at least first and second measurement modules; and receiving, by the central controller, from each of the at least first and second measurement modules, over a broadcast bus, messages reporting current measurement by respective current sensors of each of the measurement modules measuring respective source currents, using the crosstalk compensation factors;

wherein the at least first and second measurement modules are configured to monitor, over the broadcast bus, the messages reporting current measurements transmitted from other measurement modules connected to the broadcast bus, of current measurements made by respective current sensors of the other measurement modules measuring other respective source currents;

wherein the at least first and second measurement modules are configured to determine a respective reported current that is computed as a function of at least (i) a current measurement by the current sensor of respective ones of the at least first and second measurement modules, (ii) the reported current measurements from the other measurement modules, and (iii) the crosstalk compensation factors received from the central controller; and wherein the at least first and second measurement modules are configured to transmit the determined respective reported current over the broadcast bus to at least one of (i) the other measurement modules and (ii) to the central controller.

20. The method of claim 19, wherein the crosstalk compensation factors include distance factors based on respective distances separating the current sensors of each of the at least first and second measurement modules, and phase difference factors based on respective differences between phases of source currents measured by each of the at least first and second measurement modules.

* * * * *